United States Patent
Schmenn et al.

(10) Patent No.: US 12,463,115 B2
(45) Date of Patent: Nov. 4, 2025

(54) ELECTROSTATIC DISCHARGE PROTECTION CIRCUIT

(71) Applicant: Infineon Technologies AG, Neubiberg (DE)

(72) Inventors: Andre Schmenn, Sachsenkam (DE); Klaus Diefenbeck, Munich (DE); Joost Adriaan Willemen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/442,671

(22) Filed: Feb. 15, 2024

(65) Prior Publication Data

US 2024/0186220 A1  Jun. 6, 2024

Related U.S. Application Data

(63) Continuation of application No. 17/532,446, filed on Nov. 22, 2021, now Pat. No. 11,929,305.

(30) Foreign Application Priority Data

Nov. 23, 2020  (EP) ..................................... 20209267

(51) Int. Cl.
 *H01L 23/482* (2006.01)
 *H10D 84/03* (2025.01)
 *H10D 89/60* (2025.01)
 *H01L 21/56* (2006.01)

(52) U.S. Cl.
 CPC ....... *H01L 23/4825* (2013.01); *H10D 84/038* (2025.01); *H10D 89/921* (2025.01); *H01L 21/56* (2013.01); *H10D 89/611* (2025.01)

(58) Field of Classification Search
 None
 See application file for complete search history.

(56) References Cited

U.S. PATENT DOCUMENTS

| | | | |
|---|---|---|---|
| 8,441,104 B1 | 5/2013 | Hu et al. | |
| 9,337,179 B2 | 5/2016 | Yoo | |
| 2004/0012052 A1 | 1/2004 | Kawamoto | |
| 2004/0026728 A1 | 2/2004 | Yoshida et al. | |
| 2006/0220178 A1 | 10/2006 | Kubo et al. | |
| 2011/0089541 A1 | 4/2011 | Shau | |
| 2013/0285196 A1 | 10/2013 | Dissegna et al. | |
| 2016/0343701 A1 | 11/2016 | Zhong et al. | |
| 2017/0025402 A1* | 1/2017 | Opoczynski | H10D 62/124 |

(Continued)

FOREIGN PATENT DOCUMENTS

| | | |
|---|---|---|
| CN | 108109957 A | 6/2018 |
| JP | 2014165358 A | 9/2014 |

*Primary Examiner* — Bilkis Jahan
(74) *Attorney, Agent, or Firm* — Murphy, Bilak & Homiller, PLLC

(57) ABSTRACT

An electrostatic discharge protection circuit includes: a first electrostatic discharge protection device structure; a first contact pad above the first electrostatic discharge protection device structure in a cross-sectional view; and below the first electrostatic discharge protection device structure in the cross-sectional view, a metal connection coupling the first electrostatic discharge protection device structure to a second contact pad remote from the first contact pad, wherein the metal connection in the cross-sectional view only partially overlaps the first electrostatic discharge protection device structure.

11 Claims, 8 Drawing Sheets

(56) References Cited

U.S. PATENT DOCUMENTS

| | | | |
|---|---|---|---|
| 2017/0178990 A1* | 6/2017 | Oster | H01L 24/32 |
| 2018/0096984 A1* | 4/2018 | Schmenn | H01L 23/5386 |
| 2018/0180913 A1* | 6/2018 | Yeom | H10D 89/921 |
| 2018/0254389 A1* | 9/2018 | Perzlmaier | H10H 20/853 |
| 2019/0051802 A1* | 2/2019 | Perzlmaier | H10H 20/852 |
| 2019/0229143 A1 | 7/2019 | Wright | |
| 2019/0312081 A1 | 10/2019 | Odnoblyudov et al. | |
| 2019/0363232 A1* | 11/2019 | Murthy | H01L 22/32 |

* cited by examiner

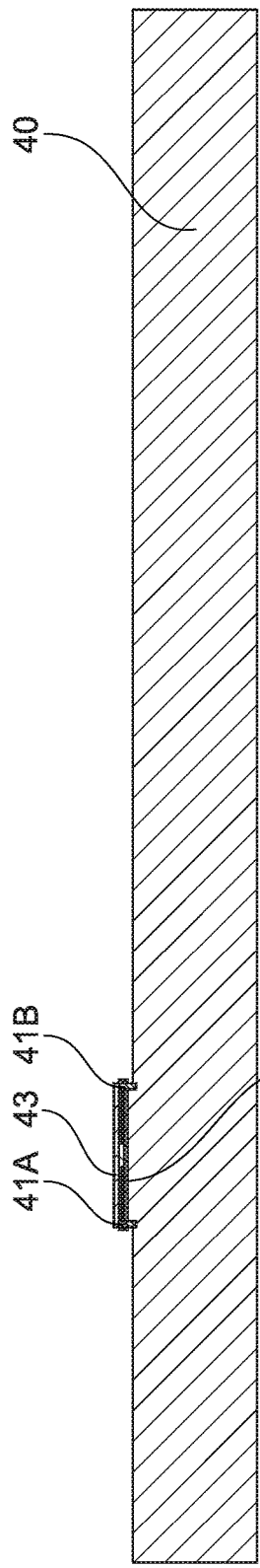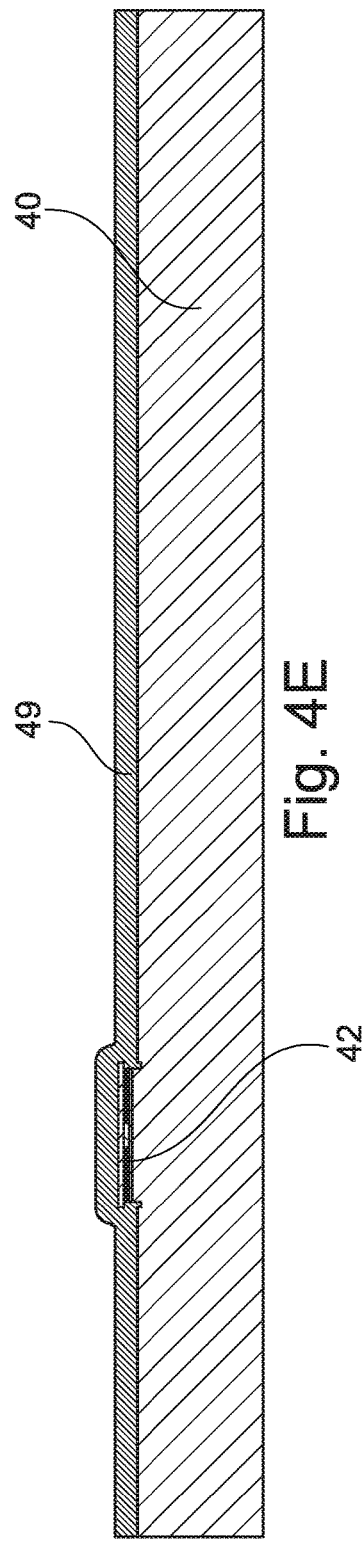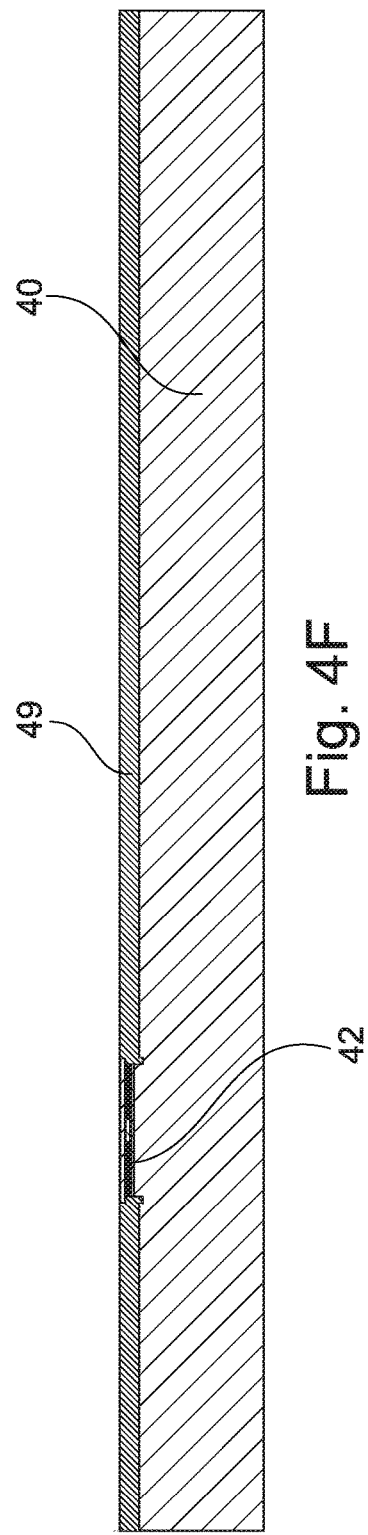

ELECTROSTATIC DISCHARGE PROTECTION CIRCUIT

TECHNICAL FIELD

The present application relates to methods for manufacturing electrostatic discharge protection circuits and to corresponding electrostatic discharge protection circuits.

BACKGROUND

Electrostatic discharges (ESD) may adversely affect, for example even melt or destroy, tiny structures in integrated circuits (ICs). Such electrostatic discharges may for example occur when a human touches terminals like pads of the integrated circuit. To prevent or at least mitigate such problems, input and output pads of integrated circuits are typically connected to ESD protection circuits, which are designed to shunt electrostatic discharges to ground or another potential.

In various applications, development of more powerful electric circuits, minimization of structures, reducing of gate oxide thickness and the like led to increasing requirements to such electrostatic discharge protection circuits. One example for such applications are state of the art interfaces like universal serial bus (USB) 3.1 or 4 interfaces, high definition multimedia interfaces (HDMI) or thunderbolt interfaces. In order to provide a good protection in case of an electrostatic discharge, the intrinsic resistance of the ESD protection circuit when an electrostatic discharge is to be shunted for example to ground has to be minimized.

On the other hand, during normal operation, an electrostatic discharge circuit may act as a parasitic capacitance to a device where it is incorporated. In particular for higher frequency applications like the above-mentioned interfaces, minimization of such capacitances provided by the electrostatic discharge protection circuit is desirable to maintain signal integrity of signals transmitted over the interface. Similar considerations may apply to other input/output pads of circuits and devices other than interfaces.

SUMMARY

According to an embodiment, a method is provided, comprising: forming a first electrostatic discharge protection device structure in a first area on a front side of a semiconductor substrate; forming a first contact pad on the first electrostatic discharge protection device structure and a second contact pad in a second area on the front side of the semiconductor substrate; thinning a back side of the semiconductor substrates; and forming a metal connection connecting the first electrostatic discharge protection device to the second area.

According to another embodiment, an electrostatic discharge protection circuit is provided, comprising: a first electrostatic discharge protection device structure; a first contact pad above the first electrostatic discharge protection device structure in a cross-sectional view; a metal connection coupling below the first electrostatic discharge protection device structure in a cross-sectional view coupling the first electrostatic discharge protection device structure to a second contact pad remote from the first contact pad, wherein the metal connection in the cross-sectional view only partially overlaps the first electrostatic discharge protection device structure.

The above summary is merely intended to give a brief overview over some features of some embodiments and is not to be construed as limiting in any way.

BRIEF DESCRIPTION OF THE DRAWINGS

FIGS. 4A to 4I are cross-sectional views of an electrostatic discharge protection circuit according to an embodiment in various stages of front side processing.

DETAILED DESCRIPTION

In the following, various embodiments will be discussed in detail referring to the attached drawings. It should be noted that these embodiments are given by way of example only and are not to be construed as limiting. For example, while specific semiconductor devices are formed in the embodiments as electrostatic discharge protection devices, for example Zener diodes, other semiconductor devices used for electrostatic discharge protection, for example thyristors, transistors or pin diodes, may also be used.

Furthermore, in addition to the features explicitly described (for example structural features, method steps, components, elements or the like), additional features, for example features employed in conventional electrostatic discharge protection circuits, in particular silicon controlled rectifier (SCR) based protection devices, may also be used and are not described in detail. In particular, described in the following are various embodiments of manufacturing an SCR based ESD protection device, and structural features resulting from the method. Apart from these methods for manufacturing and corresponding structural features, the SCR based ESD protection circuits according to embodiments may operate and be implemented similar to conventional SCR based ESD protection circuits.

Features from different embodiments may be combined unless noted otherwise. Variations or modifications described with respect to one of the embodiments are also applicable to other embodiments and will therefore not be described repeatedly. Connections or couplings as described herein refer to electrical connections or couplings unless noted otherwise. Such connections or couplings may be modified as long as the general purpose of the connection or coupling, for example to transmit a signal or to provide a voltage, is essentially maintained.

Figure 1A:
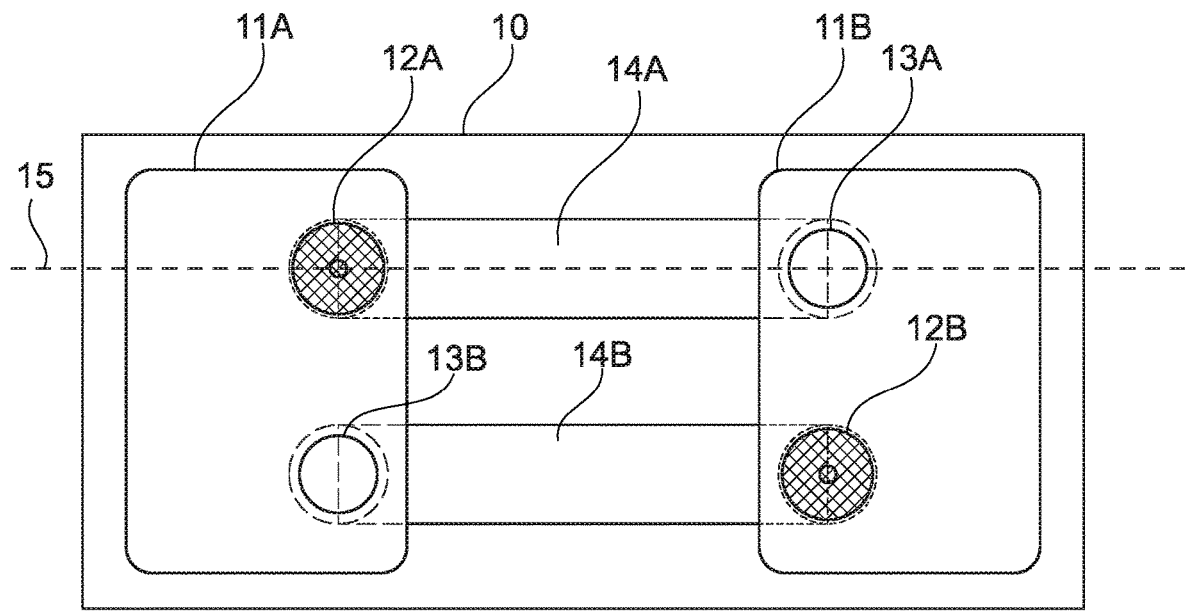
FIG. 1A is a top view of an electrostatic discharge protection circuit according to an embodiment.
Figure 1B:
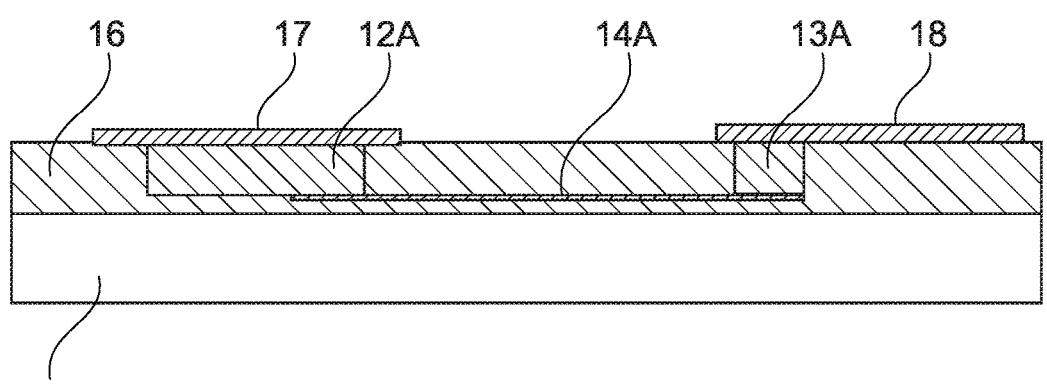
FIG. 1B is a cross-sectional view of the circuit of FIG. 1A along a line 15 of FIG. 1A.

Turning now to the Figures, FIG. 1A is a top view of an electrostatic discharge (ESD) protection circuit 10 according to an embodiment, and FIG. 1B is a schematic cross-sectional view along a line 15 of FIG. 1A. The terms top view and cross-sectional view as used herein relate to views as in FIGS. 1A and 1B, where for a top view on looks onto a device or circuit, whereas the cross-sectionals view shows a cross-section through the device or circuit, to be able to see for example various layers formed during manufacturing of the device of circuit. The electrostatic discharge protection circuit 10 is configured as an antiparallel silicon controlled rectifier (SCR) ESD protection circuit, but this is not to be construed as limiting.

Circuit 10 may be a stand-alone device which is coupled to other circuit parts (see below description of FIG. 3) via connections like bond wires, or may be integrated with other components like a circuit to be protected from electrostatic discharges on a same chip.

Circuit 10 comprises a first area 11A and a second area 11B. First area 11A, second area 11B or both may be semiconductor areas where semiconductor devices are formed as protection devices. Between areas 11A and 11B, as will be described further below in more detail, semiconductor material is removed. In particular, in embodiments all semiconductor material outside first area 11A and second area 11B is removed. This may help to reduce parasitic capacitances. In other embodiments, further areas including further semiconductor devices may be provided in addition to first area 11A and second area 11B.

First area 11A comprises a first semiconductor device as a first ESD protection device 12A, and second semiconductor area 11B comprises a second semiconductor device as a second ESD protection device 13A. In some embodiments, instead of second ESD protection device 13A, merely a contact may be provided. For ease of explanation, in the following only the term ESD protection device will be used, with the understanding that this device may also include only a contact. First ESD protection device 12A and second ESD protection device 13A are coupled by a metal conductor 14A. As can be best seen in the cross-section of FIG. 1B, the space between the first semiconductor 11A and 11B may be filled by a dielectric material 16, for example a silicon dioxide or silicon nitride material, and is free from semiconductor material. In the example of FIGS. 1A and 1B, ESD protection devices 12A, 13A are formed as vertical devices, with current generally flowing in a vertical direction perpendicular to a surface of the device (vertical direction in the view of FIG. 1B).

Metal conductor 14A is provided at a side of a carrier 19. As will be explained further below, carrier 19 may be a mold material. Furthermore, first ESD protection device 12A is electrically coupled to a metal contact pad 17, and second ESD protection device 13A is coupled to a metal contact pad 18. Via contact pads 17, 18 electrostatic discharge protection circuit 10 may be coupled to input/output terminals, supply terminals and circuits to be protected, as will be explained further below referring to FIG. 2.

In some implementations of an ESD protection circuit, first ESD protection device 12A may include a Zener diode, and second ESD protection device 13A may include a pin diode or contact. In other implementations, first ESD protection device 12A and/or second ESD protection device 13A may include other devices like transistors or thyristors, or any other devices also used in conventional ESD protection circuits.

Furthermore, second area 11B comprises a third ESD protection device 12B, and first area 11A comprises a fourth ESD protection device 13B, which are coupled by a metal conductor 14B. Third ESD protection device 12B may be the same type of device as first ESD protection device 12A, and fourth ESD protection device 13B may be the same type of device as second ESD protection device 13A. In this way, an antiparallel configuration of the ESD protection devices may be obtained. Such an antiparallel configuration may serve to reduce a clamping voltage. In other embodiments, third and fourth semiconductor devices 12B, 13B as well as metal conductor 14B may be omitted.

Figure 2:
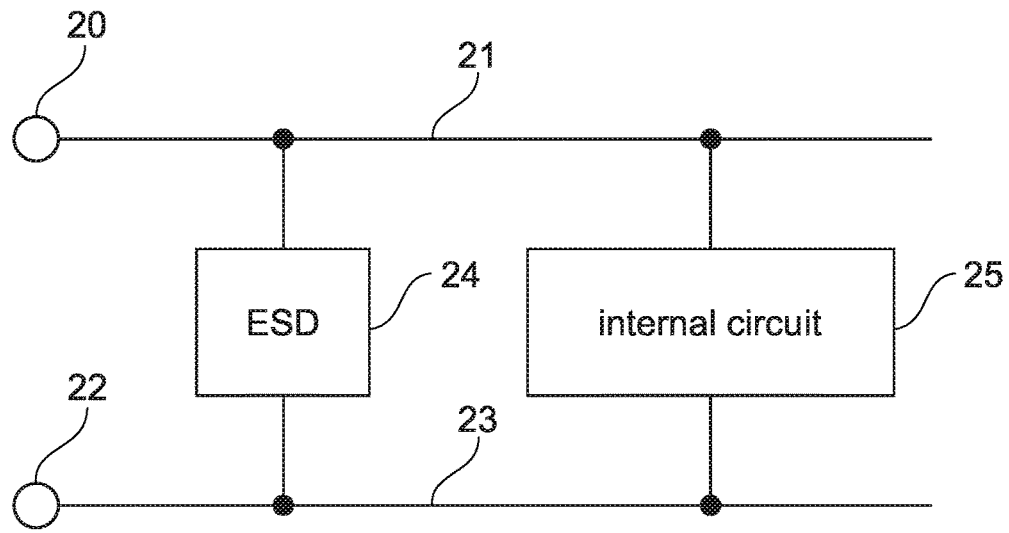
FIG. 2 illustrates use of an electrostatic discharge protection circuit according to various embodiments for protecting an internal circuit.

FIG. 2 illustrates the use of an ESD protection circuit 24 according to embodiments described herein (e.g. circuit 10 described above or any of the circuits described below) to protect an internal circuit 25. The embodiment of FIG. 2 comprises a first external terminal 20 coupled to a first rail 21 and a second external terminal 22 coupled to a second rail 23. In embodiments, first external terminal 20 may for example be a positive supply voltage terminal or an input/output (I/O) terminal, and second terminal 22 may be a ground terminal. Internal circuit 25 may be any kind of circuit to be protected and to receive signals or voltages from external terminals 20, 22, like a logic circuit, a processor, an application specific integrated circuit or the like.

ESD protection circuit 24 is coupled between first rail 21 and second rail 23. ESD protection circuit 24 may for example be implemented as shown in FIGS. 1A and 1B or as explained in more detail below with reference to FIGS. 4-6. In this case, for example contact pad 17 of FIG. 1B may be coupled to first rail 21, and contact pad 18 may be coupled to second rail 23. A corresponding contact pad of third semiconductor device 12B in this case may then be coupled to second rail 23, and a corresponding contact pad of fourth semiconductor device 13B may be coupled to first rail 21.

When for example an electrostatic discharge occurs at external terminal 20, ESD protection circuit 24 becomes conducting, and charge may be shunted from first external terminal 20 to second rail 23 and then to ground via external terminal 22, without damaging internal circuit 25. This corresponds to the usual operation of ESD protection circuits and will therefore not be explained in more detail.

In the ESD protection circuit of FIGS. 1A and 1B, as will now be explained in detail, contact pads 17, 18 are formed during front side processing of a semiconductor substrate, for example a semiconductor wafer, and metal connection 14A is formed during a back side processing. Generally, semiconductor substrates, like semiconductor wafers include a front side and a back side. The front side is intended for formation of semiconductor devices and is usually treated in a special manner by various polishing steps by a manufacturer of the semiconductor substrate to e.g. provide a surface with very low defect density and a high degree of planarity. The back side of the semiconductor substrate, on the other hand, in many cases has to fulfill less strict requirements. Therefore, front side and back side of a semiconductor substrate like a semiconductor wafer are well defined in this sense. Front side processing refers to processing performed on a front side of a wafer (for example implantation or diffusion from a front side, layer deposition like dielectric material deposition or metal deposition on a front side, etching on the front side etc.), whereas back side processing refers to corresponding processing on the back side.

Figure 3:
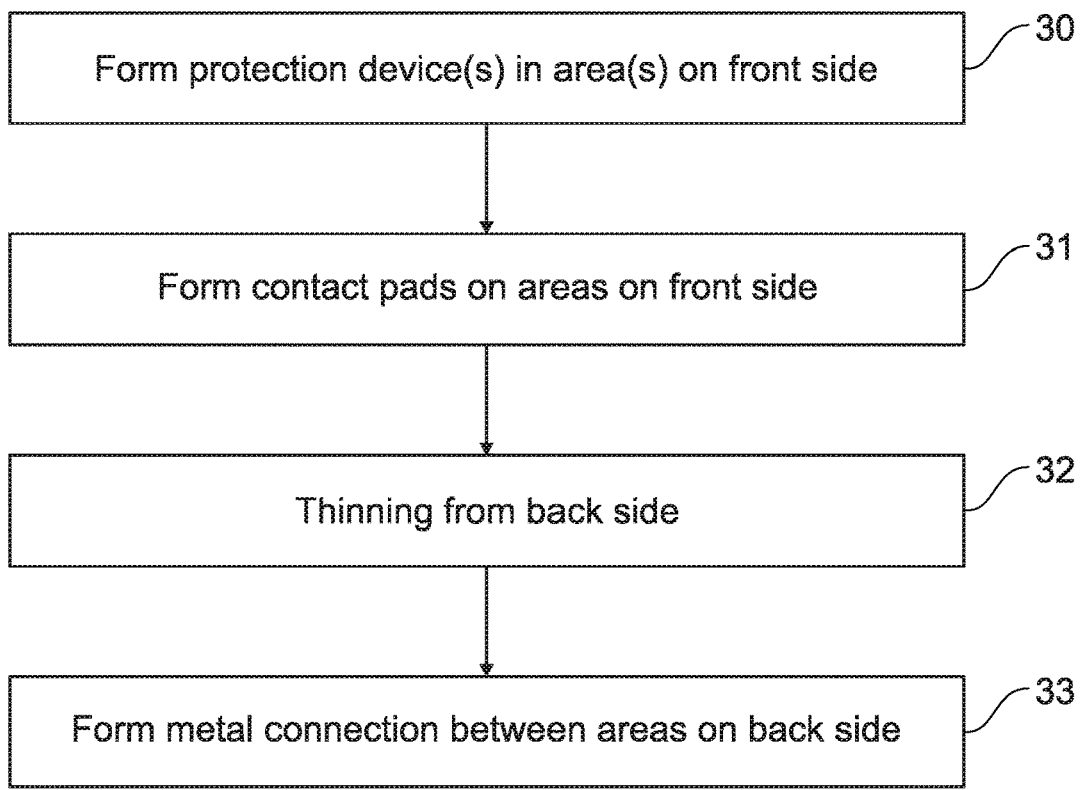
FIG. 3 is a flowchart illustrating a method according to some embodiments.

FIG. 3 is a flowchart illustrating a method according to some embodiments.

The method of FIG. 3 may be for example used for manufacturing ESD protection circuit 10 shown in FIGS. 1A and 1B or to manufacture ESD protection circuits as described further below.

For better understanding, the method of FIG. 3 will be described referring to FIGS. 1A and 1B first. Then, a detailed, non-limiting implementation possibility for the method of FIG. 3 will be explained referring to FIGS. 4A-4I and FIGS. 5A-5F.

At 30 in FIG. 3, the method comprises forming one or more ESD protection devices on a front side of a semiconductor substrate. ESD protection devices are devices which serve for ESD protection, for example semiconductor devices that become conducting in case of an electrostatic discharge. In FIGS. 1A and 1B, first through fourth ESD protection devices 12A, 13A, 12B and 13B are examples for such ESD protection devices.

At 31, the method comprises forming contact pads on areas on the front side of the semiconductor substrates, for example contact pads 17 and 18 shown in FIG. 1B. The acts and events described at 30 and 31 therefore correspond to a front side processing.

At 32, the method comprises a thinning of the semiconductor substrate from a backside thereof. Thinning refers to a process where a thickness of the semiconductor substrate is reduced. In embodiments, the thickness may be reduced to only a few percent or less of the original thickness of the semiconductor substrate.

At 33, the method comprises forming a metal connection, for example metal connections 14A, 14B of FIGS. 1A and 1B, on the back side of the semiconductor substrate to connect ESD protection devices formed in different areas.

Optionally, between 32 and 33, one or more further devices or parts thereof may be formed on the thinned backside. These may be contacted by the metal connection formed at 33, but may also be electrically isolated therefrom and connected only via contact pads formed at 31.

Therefore, in the embodiment of FIG. 3 the contact pads are formed during front side processing, whereas the metal connection is formed during back side processing. In some implementations, as will be explained in more detail further below, this may lead to a reduced capacitance of the ESD protection circuit, and/or may lead to expanded possibilities for carriers and packaging of the ESD protection circuit.

Next, an implementation example of the method of FIG. 3 and corresponding ESD protection circuits will be discussed referring to FIGS. 4A-4I and 5A-5F, where FIGS. 4A-4I show cross-sectional views of an ESD protection circuit in various stages of front side processing, and FIGS. 5A-5F show cross-sectional views of the ESD protection circuit in various stages of back side processing. The cross-sectional view is a cross section through a device at a similar position as the cross-sectional view of FIG. 1B. In some embodiments, an antiparallel circuit as shown in FIG. 1A may be manufactured by the method. In this case, the processing illustrated is performed for two cross sections to form corresponding semiconductor devices and other structures, as generally discussed with reference to FIGS. 1A and 1B.

While FIGS. 4A-4I and 5A-5F show numerous details, this is just for illustration purposes, and it is to be understood that these details show a particular implementation, and other implementations are equally possible.

Figure 4A:
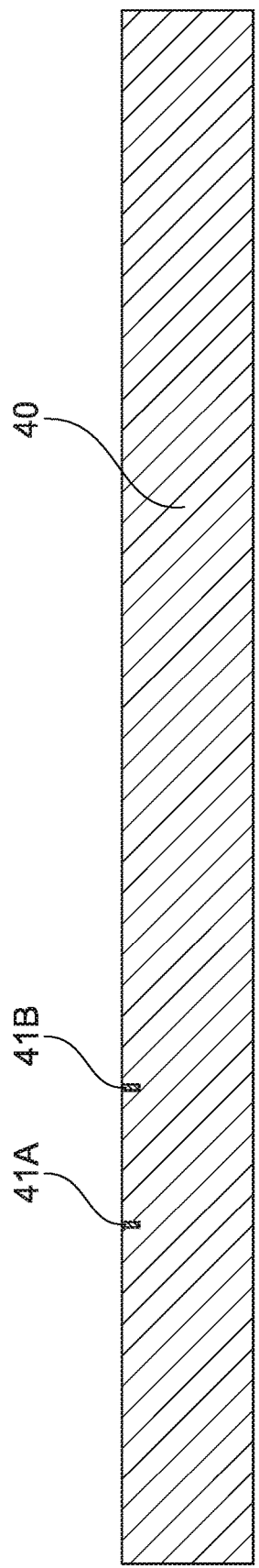
Figure 4B:
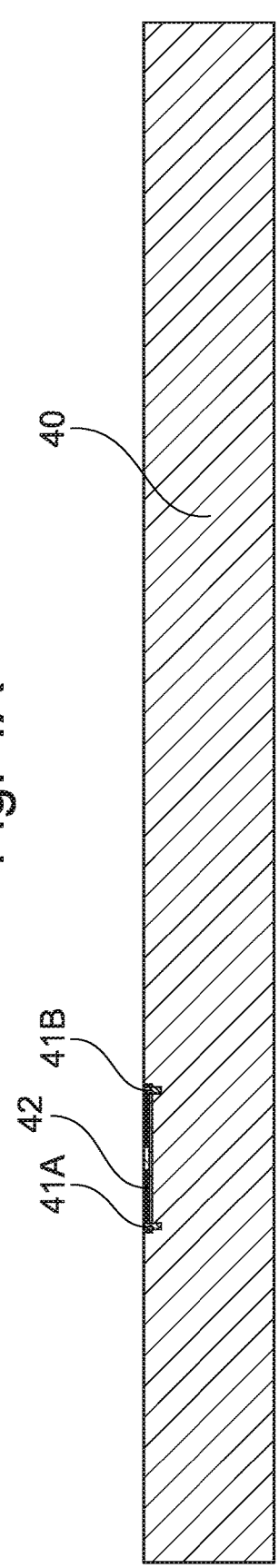

For example, FIGS. 4A and 4B show the formation of an ESD protection circuit including a Zener diode, but as mentioned previously, other semiconductor devices like thyristors, transistors or pin diodes may also be formed in ESD protection circuits.

In FIGS. 4A-4I and 5A-5F, the same reference numerals designate the same elements. For a clearer representation, not all of the reference numerals are repeated in each of FIGS. 4A-4I and FIGS. 5A-5F. This is not to be construed as indicating that the respective features designated by the reference numerals have necessarily been removed.

In FIG. 4A, a semiconductor substrate 40, for example a semiconductor wafer like a silicon wafer, is provided. Other semiconductor materials than silicon may also be used, for example group III-V compounds like gallium arsenide, or group IV compounds like silicon carbide. Trenches 41A, 41B are formed in semiconductor substrate 40 and filled with a dielectric material, for example silicon dioxide or silicon nitride. These filled trenches 41A, 41B serve as an alignment structure, i.e. as reference markers, for the subsequent processing and also as side walls for mesa etching described further below.

Next, in FIG. 4B, a semiconductor device structure 42 for an ESD protection device is formed by implantation doping, diffusion doping or other semiconductor processing. For example, an n well and a p well may be formed. The device structure 42 formed depends on the type of semiconductor device to be used as ESD protection device. As mentioned, in the example currently discussed, a Zener diode may be formed. On top of device structure 42, highly doped regions are formed to serve as contact regions to metal contact pads later on.

Figure 4C:
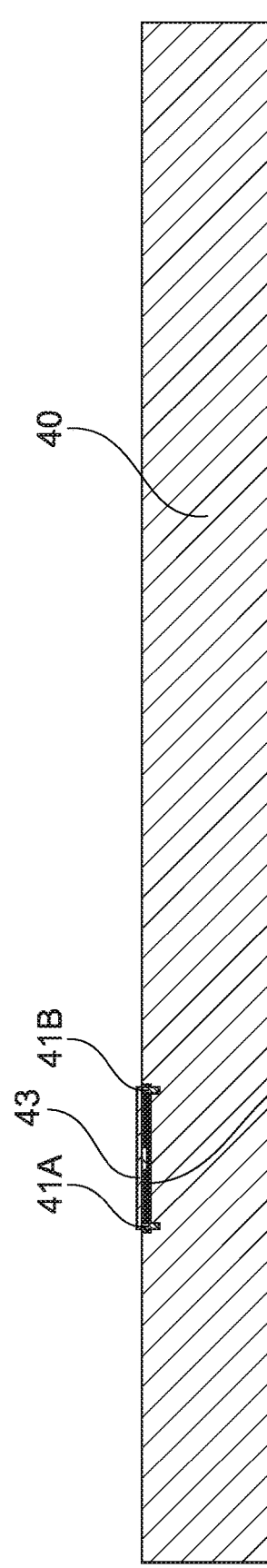

Next, as shown in FIG. 4C, the device structure 42 is covered by a dielectric material 43 serving as a hard mask between filled trenches 41A, 41B for subsequent etching. The same dielectric materials as for filling trenches 41A, 41B may be used in some embodiments.

Next, as shown in FIG. 4D, a mesa etching is performed, which means that substrate 40 is etched in all areas apart from the area covered by dielectric material 43. Trenches 41A, 41B form the side wall of the mesa thus formed, as shown in FIG. 4D.

Next, as shown in FIG. 4E, substrate 40 is covered by a dielectric layer 49, for example a silicon dioxide layer. This oxide layer is then planarized for example by chemical mechanical polishing (CMP) as shown in FIG. 4F. It should be noted that no precise planarization is required, but merely the elevated part above device structure 42 is removed, as illustrated in FIG. 4F.

Figure 4G:
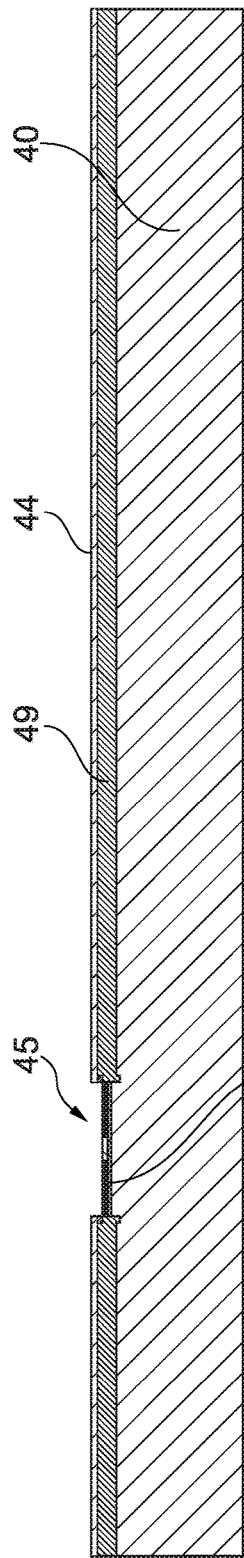

Next, as shown in FIG. 4G, a passivation layer 44 is provided on dielectric layer 49 except for an area of device structures 42, passivation layer 44 protecting dielectric layer 43 from removal. Then, dielectric layer 49 is removed in the area of device structures 42, as indicated by an arrow 45. In case of silicon dioxide as dielectric layer 49, such a removal may for example be performed by etching with hydrofluoric acid.

Figure 4H:
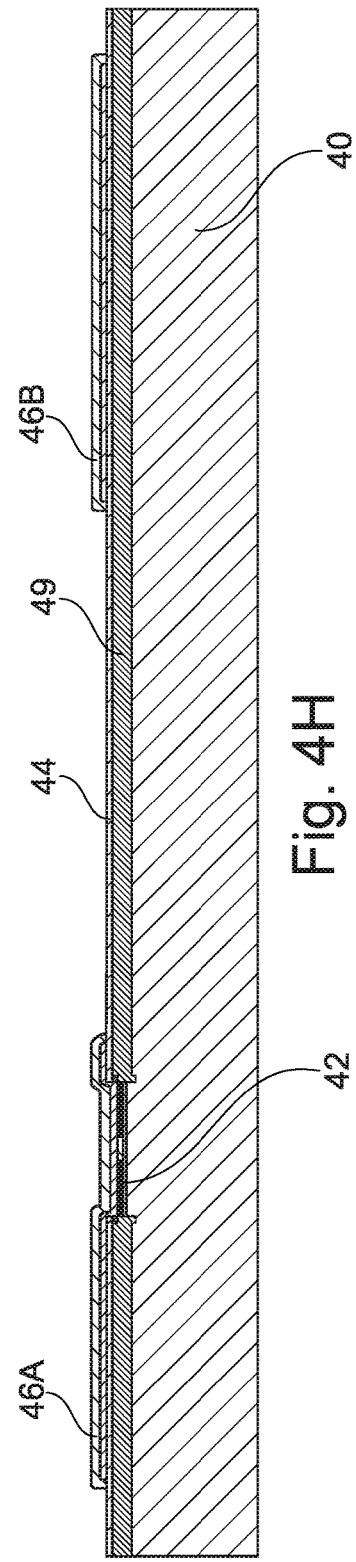

Next, as shown in FIG. 4H, contact pads 46A, 46B made of metal are provided. These contact pads may for example be deposited using electroless (e-less) plating techniques. Contact pad 46A contacts device structure 42 and for example may correspond to contact pad 17 of FIG. 1B. Contact pad 46B is provided remote from device structures 42 and is an example for contact pad 18 of FIG. 1B in a case where instead of semiconductor device 13A essentially only a contact is provided. In other embodiments, in an area covered by contact pad 46B, a further device structure for forming an ESD protection device may be formed similar to device structures 42 during the processing steps discussed with reference to FIGS. 4A to 4G.

Figure 4I:
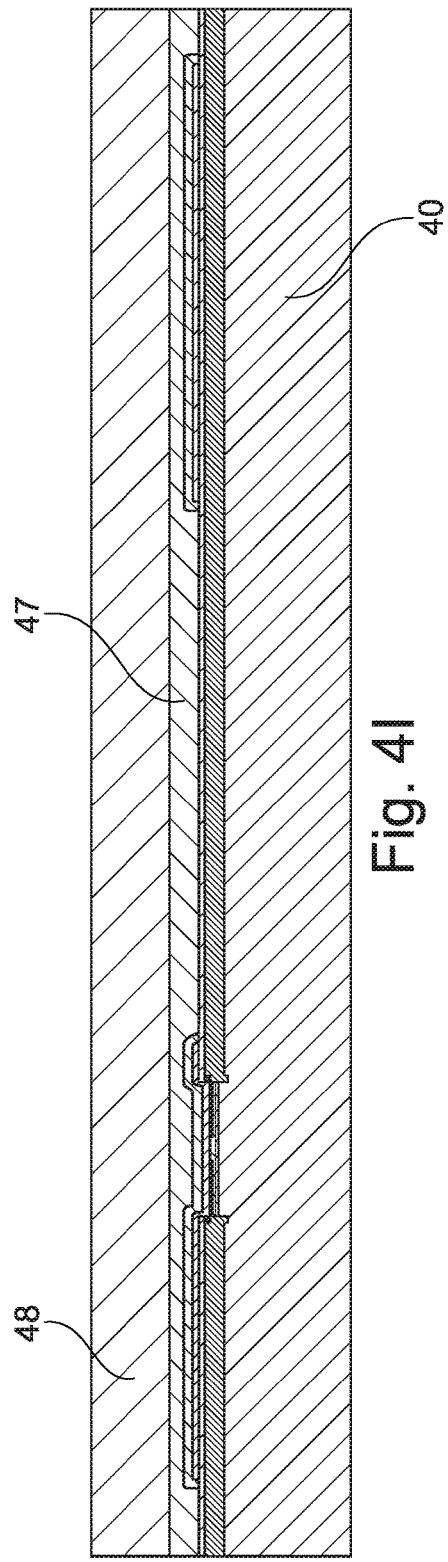

At the end of the front side processing, in FIG. 4I for the subsequent back side processing a temporary carrier 48 is mounted to the front side of substrate 40 using an adhesive 47. Adhesive 47 may be a glue or other suitable adhesive, and temporary carrier 48 may be a glass carrier, but is not limited thereto. Temporary carrier allows handling of the device during processing of the back side of semiconductor substrate 40.

An example for back side processing will now be described referring to FIGS. 5A to 5F. It should be noted that in FIGS. 5A-5F, compared to FIGS. 4A-4I, the representation is tilted by 180°, such that temporary carrier 48 now is shown at the bottom of the structure.

Figure 5A:
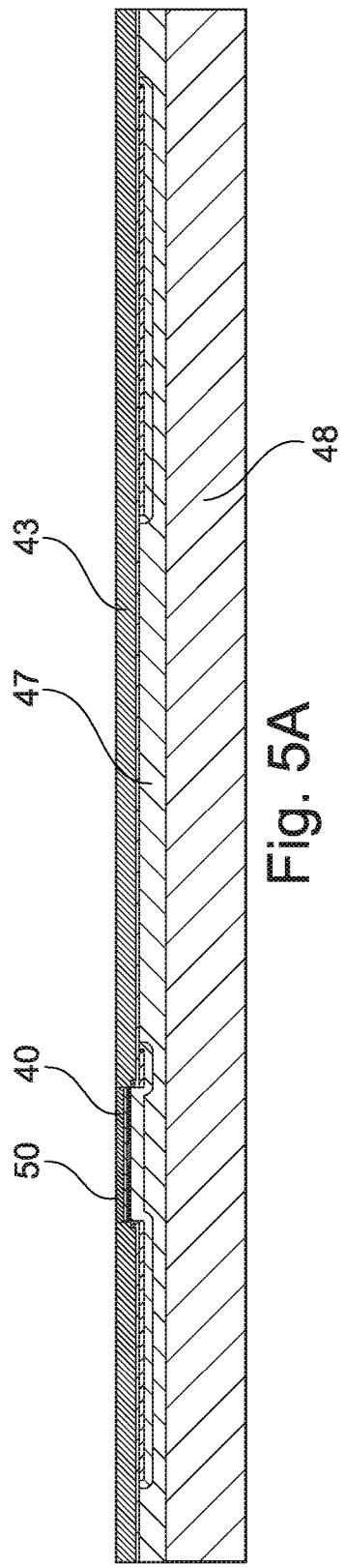
FIGS. 5A to 5F are cross-sectional views of an electrostatic discharge protection circuit according to an embodiment in various stages of back side processing.

As can be seen in FIG. 5A, at the beginning of back side processing substrate 40 is thinned from the back side. Essentially, the whole of substrate 40 is removed during this thinning apart from a small part between trenches 31A, 31B below device structures 40. Therefore, only a few percent or even below one percent of the original substrate thickness remains. This leads to a formation of a semiconductor area surrounded by dielectric material 43. This also means that for example in cases where a further device is formed as above, no connection between the device of device structures 42 and the further device via semiconductor structures exists. This may help to reduce a capacitance of the ESD protection circuit. Furthermore, as shown in FIG. 5A a highly doped region 50 is provided on substrate 40, which serves as a contact region. This highly doped region may be performed by implantation or diffusion doping or any other suitable technique. Subsequently, the contact area is annealed for example using laser thermal annealing in order to reduce defects caused by the doping. Also, devices or parts thereof may be formed in addition to highly doped region 50. For example, a pin diode may be formed coupled to contact pad 46B.

Figure 5B:
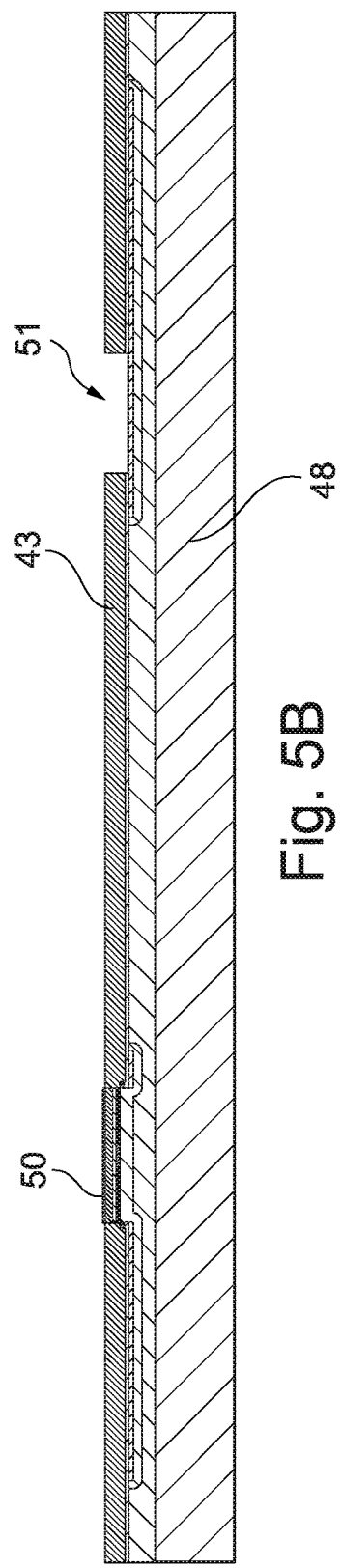
Figure 5C:
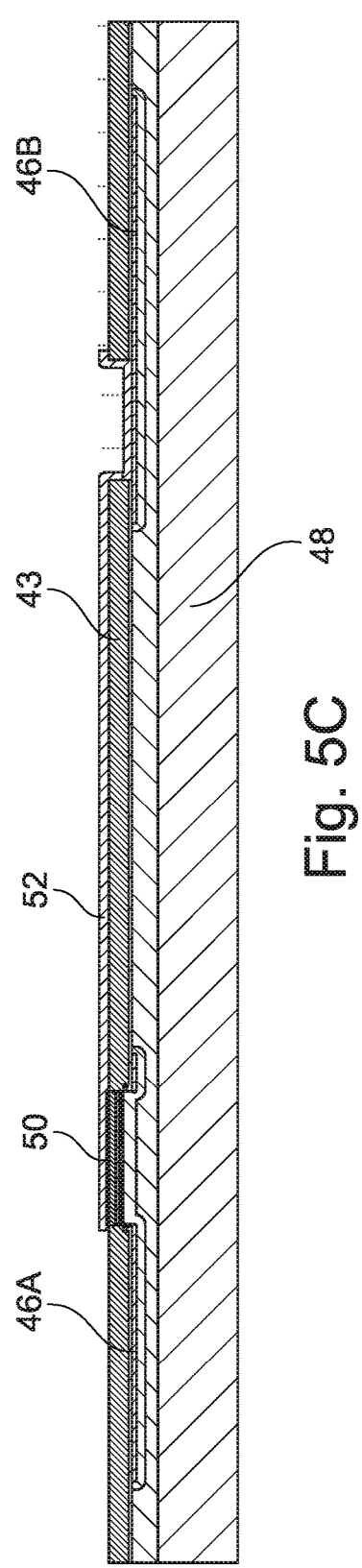

Next, as shown in FIG. 5B, a hole is formed in dielectric layer 43 as indicated by an arrow 51 to be able to contact contact pad 46B.

Next, a metal connection 52 is deposited coupling highly doped region 50 with pad 46B. In some embodiments, metal connection 52 is made of a silumin like AlSiCu (aluminum silicon copper) or other aluminum compounds. Metal connection 52 corresponds for example to metal connections 14A, 14B in FIGS. 1A and 1B. While in FIG. 5C metal connection 52 extends over the complete highly doped area 50, in other embodiments, as will be described below with reference to FIG. 6A, it may only extend over a part the device structure to reduce parasitic capacitances between metal connection 52 and pad 56A, as long as sufficient electrical contact is provided.

Figure 5D:
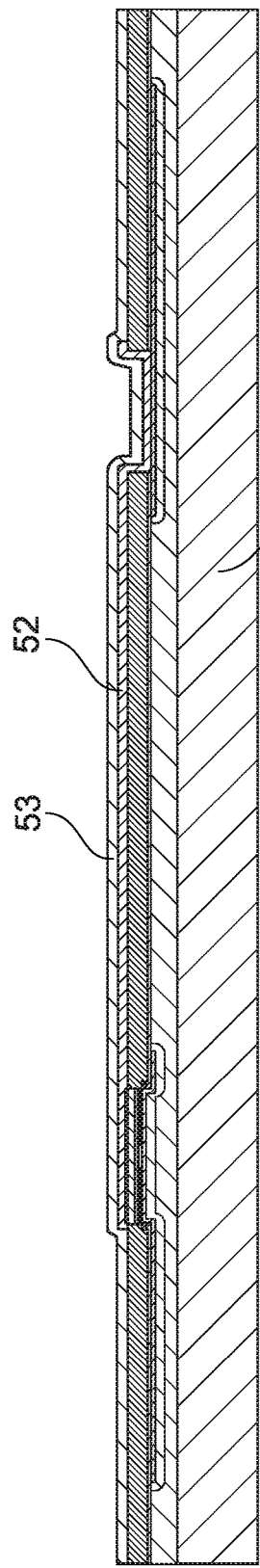

Next, as shown in FIG. 5D, metal connection 52 and the complete back side is covered by a passivation layer 53. As an example, an oxide like silicon dioxide covered by a nitride like silicon nitride may be used. In other implementations, an organic material may be used. In some embodiments, the passivation layer 53 may be left open in kerf regions of a silicon wafer. In semiconductor manufacturing, usually a plurality of devices like the circuits shown and discussed herein are formed on a silicon wafer or other semiconductor wafer simultaneously and are then diced to form separate devices. The kerf region is the region where such dicing occurs.

Figure 5E:
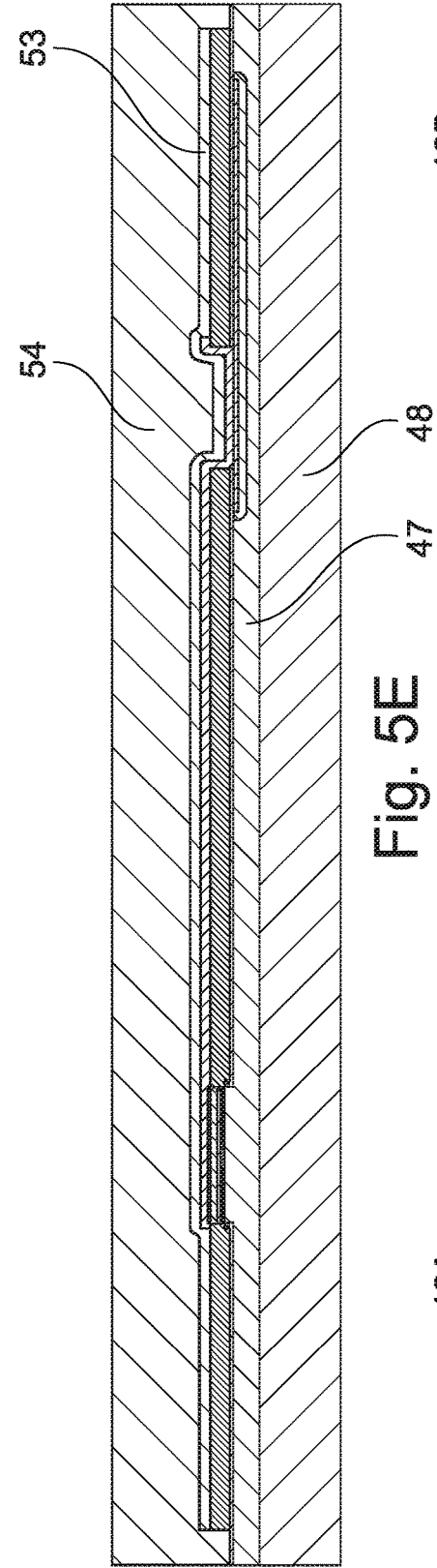

Next, as shown in FIG. 5E, a mold compound layer 54 is provided. In the example of FIG. 5E, passivation layer 53 is omitted in a kerf region, such that the mold compound layer 54 covers the circuit also from the sides (left and right in FIG. 5E).

In other embodiments, instead of mold compound layer 54, a carrier like a glass carrier may be bonded permanently to the structure shown. As in the process shown mold 54 or any other carrier is provided essentially at the end of the processing flow, there is a greater choice in carriers. For example, providing a mold may be more difficult in some conventional approaches where a permanent carrier is provided between front side processing and back side processing, as some choices of mold or carriers may not be suitable for subsequent processing steps like annealing steps.

Figure 5F:
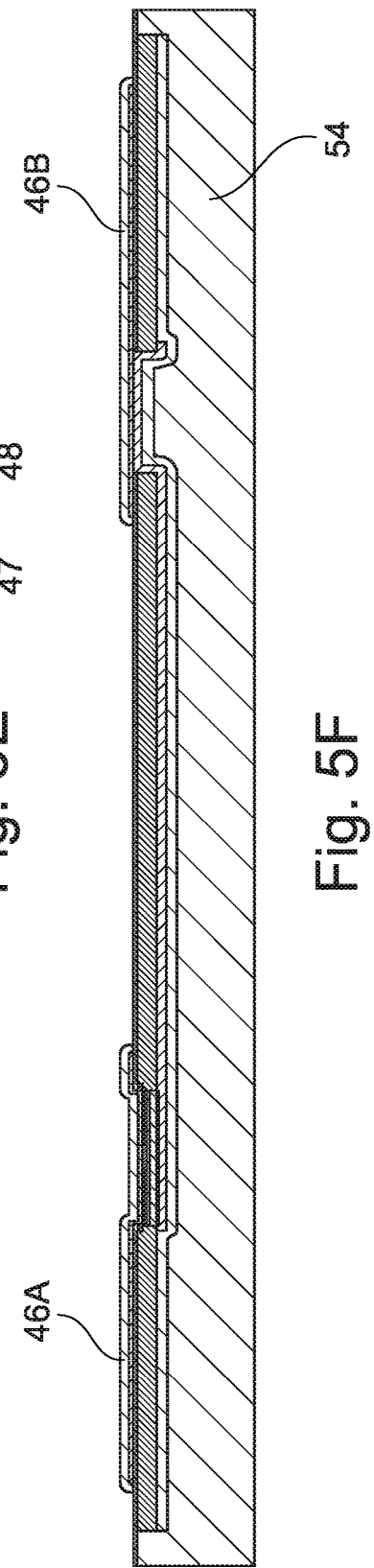

As shown in FIG. 5F, then the temporary carrier 48 and glue 47 are removed, and a dicing is performed to obtain separate ESD protection circuits. The dicing process used may depend on mold material 54 or other carriers. For example, laser dicing may be used, or in case of a glass carrier a laser procedure for cutting and drilling the glass carrier may be used. In case of a silicon carrier, also a grinding process may be used for dicing.

Figure 6A:
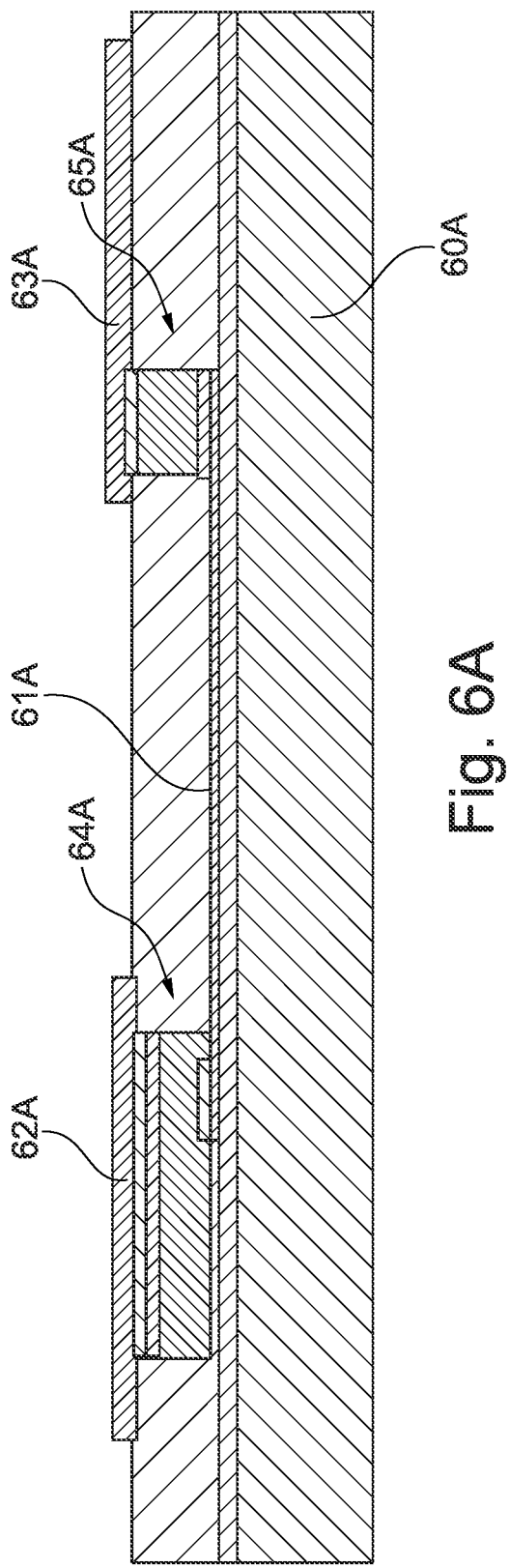
FIG. 6A is a cross-sectional view of an electrostatic discharge protection circuit according to an embodiment.

Next, some properties of ESD protection circuits manufactured with methods as discussed compared to conventional ESD protection circuits manufactured with conventional methods will be explained with reference to FIGS. 6A and 6B. FIG. 6A shows a cross-sectional view of an ESD protection circuit according to an embodiment, similar to the cross-sectional views shown previously, and FIG. 6B shows a cross-sectional view of a comparative example with somewhat reversed process flow, where a metal connection is formed during front side processing and metal pads are formed during back side processing.

The circuit of FIG. 6A comprises a pnp structure (pin Zener diode or transistor) 64A in series to a pin diode 65A. This is an example where instead of a mere contact like in FIG. 5F, an additional semiconductor device is present. The circuit of the comparative example of FIG. 6B comprises a Zener diode 64B and pin diode 65B.

Pnp structure 64A is contacted by a contact pad 62A, and pin diode 65A is contacted by a contact pad 63A. Furthermore, pnp structure 64A and pin diode 65A are coupled by a buried metal connection 61A.

Figure 6B:
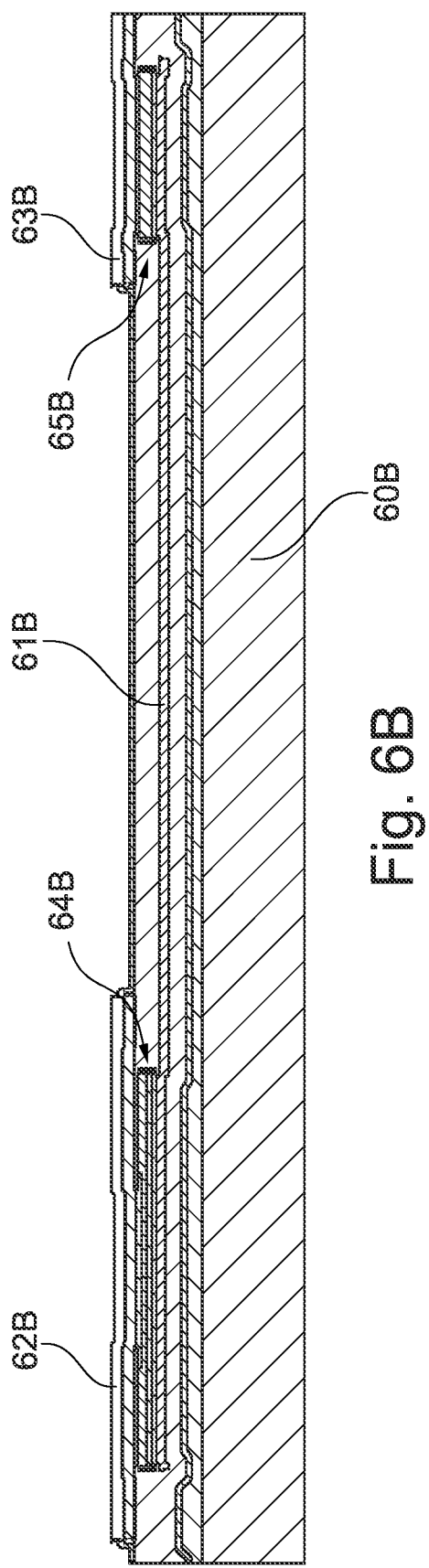
FIG. 6B is a cross-sectional view of an electrostatic discharge protection circuit according to a comparative example.

In a somewhat similar manner, where differences will be explained below, pnp structure 64B of FIG. 6B is contacted by a contact pad 62B, and pin diode 65B is contacted by a contact pad 63B.

The circuit of FIG. 6A is carried by a carrier 60A, which may be a mold compound layer as explained with reference to FIG. 5E, or another carrier. The circuit of FIG. 6B is carried by a carrier 60B, which may be a Silicon wafer fixed to the remaining structure for example using a glue.

The following differences exist between the embodiment of FIG. 6A and the comparative example of FIG. 6B. These differences at least in part may result from different manufacturing processes. For manufacturing the embodiment of FIG. 6A, essentially the process flow described with reference to FIGS. 3, 4 and 5 may be used, where in particular contact pads 62A, 63A like contact pads 46A, 46B are provided during front side processing after formation of the device structures of pnp structure 64A and pin diode 65B in front side processing, and metal connection 61A, like metal connection 52, is formed during back side processing. In contrast thereto, for manufacturing the circuit of FIG. 6B, metal connection 61B is formed after forming device structures 64B, 65B in front side processing, then carrier 60B is bonded to the structure, and then contact pads 62B, 63B are formed during back side processing.

As already mentioned, due to these differences in processing, for the embodiment of FIG. 6A there is more flexibility in choice for carrier 60A, as it is provided essentially at the end of processing. For example, carrier 60A may be provided as a mold manufactured in a molding process.

Furthermore, as indicated in FIGS. 6A and 6B, the layer structure in particular of Zener diode 64A, 64B appears reversed, or in other words, the same layer structures are formed in the front side processing, but as the contact pads and metal connections are manufactured in the respective other processing stages, the order appears reversed. This formation of the device structures is determined in many cases by the processing apparatuses and approaches used and cannot be easily reversed. This, in turn, has the consequence that the metal connection area to Zener diode 64B of metal connection 61B has to extend essentially over the complete device structure. In contrast thereto, in FIG. 6A, a comparatively small contact area may be provided, and therefore metal connection 60A may overlap over only a part of the device structure of Zener diode 64A. This, in turn, may lead to a reduced capacitance between contact pad 62A and metal connection 61A compared to the capacitance between contact pad 62B and metal connection 61B in some embodiments. Furthermore, the formation of contact pad 62A, 63A in front side processing facilitates the provision of highly doped (diffusion doped or implanted) pn junctions adjacent to the contact pads, which in FIG. 6B have to be formed also during front side processing, but adjacent to the metal connection 61B.

Therefore, in some implementations, an ESD protection circuit with reduced capacitance may be provided.

Some embodiments are defined by the following examples:

Example 1. A method, comprising: forming a first electrostatic discharge protection device structure in a first area on a front side of a semiconductor substrate, forming a first contact pad on the first electrostatic discharge protection device structure and a second contact pad in a second area on the front side of the semiconductor substrate, thinning a back side of the semiconductor substrates, and forming a metal connection connecting the first electrostatic discharge protection device structure to the second area.

Example 2. The method of example 1, further comprising providing a carrier material to the back side of the semiconductor substrate after forming the metal connection.

Example 3. The method of example 2, wherein providing the carrier material comprises molding the carrier material on the back side of the semiconductor substrate.

Example 4. The method of any one of examples 1 to 3, wherein the metal connection covers only part of an area of the first electrostatic discharge protection device structure in a cross-sectional view.

Example 5. The method of any one of examples 1 to 4, wherein the first electrostatic discharge protection device structure comprises a Zener diode structure.

Example 6. The method of example 5, wherein the first electrostatic discharge protection device structure further comprises a pin diode structure.

Example 7. The method of any one of examples 1 to 6, wherein the metal connection is electrically coupled to the second contact pad.

Example 8. The method of any one of examples 1 to 7, further comprising forming a second electrostatic discharge protection device structure between the metal connection and the second contact pad.

Example 9. The method of example 8, wherein the second device structure comprises a pin diode.

Example 10. The method of any one of examples 1 to 9, wherein forming the first electrostatic discharge protection device structure comprises forming one or more highly doped layers by diffusion doping or implantation.

Example 11. The method of any one of examples 1 to 10, further comprising forming a third electrostatic discharge protection device structure in the second area, forming a third contact pad on the third electrostatic discharge protection device structure, forming a fourth contact pad in the first area, and forming a further metal connection between the third electrostatic discharge protection device structure and the first area.

Example 12. The method of example 11, wherein the third electrostatic discharge protection device structure is the same type of device structure as the first electrostatic discharge protection device structure.

Example 13. The method of example 12, further comprising forming a fourth electrostatic discharge protection device structure between the further metal connection and the fourth contact pad.

Example 14. The method of any one of examples 1 to 13, further comprising, during front side processing, removing semiconductor material between the first area and the second area.

Example 15. The method of example 14, wherein the removing of semiconductor material comprises removing all semiconductor material outside the first area and the second area.

Example 16. The method of any one of examples 1 to 15, further comprising between the thinning and the forming of the metal connection, forming at least one device structure from the backside in at least one of the first area or the second area.

Example 17. The method of any one of examples 1 to 16, further comprising forming a further device structure in a third area of the semiconductor substrate.

Example 18. An electrostatic discharge protection circuit, comprising: a first electrostatic discharge protection device structure, a first contact pad above the first electrostatic discharge protection device structure in a cross-sectional view, a metal connection coupling below the first electrostatic discharge protection device structure in the cross-sectional view coupling the first electrostatic discharge protection device structure to a second contact pad remote from the first contact pad, wherein the metal connection in the cross-sectional view only partially overlaps the first electrostatic discharge protection device structure.

Example 19. The circuit of example 18, wherein the circuit comprises a molded carrier.

Example 20. The circuit of example 18 or 19, wherein the first electrostatic discharge protection device structure comprises one or more doped layers adjacent to the first contact pad.

Example 21. The circuit of any of examples 18 to 20, manufactured by the method of any of examples 1 to 17.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electrostatic discharge protection circuit, comprising:
    a first electrostatic discharge protection device structure;
    a first contact pad above the first electrostatic discharge protection device structure in a cross-sectional view; and
    below the first electrostatic discharge protection device structure in the cross-sectional view, a metal connection coupling the first electrostatic discharge protection device structure to a second contact pad remote from the first contact pad, wherein the metal connection in the cross-sectional view only partially overlaps the first electrostatic discharge protection device structure, wherein the first electrostatic discharge protection device structure is laterally surrounded by a dielectric material, wherein at least part of the second contact pad is uncovered by a hole in the dielectric material, wherein the metal connection contacts the second contact pad through the hole in the dielectric material, wherein the first contact pad and the second contact pad are each a metal pad.

2. The circuit of claim 1, further comprising a molded carrier.

3. The circuit of claim 1, wherein the first electrostatic discharge protection device structure comprises one or more doped layers adjacent to the first contact pad.

4. The circuit of claim 1, wherein the first electrostatic discharge protection device structure is formed in a first area on a front side of a semiconductor substrate, wherein the second contact pad is formed in a second area on the front side of the semiconductor substrate, and wherein the metal connection connects the first electrostatic discharge protection device structure to the second area.

5. The circuit of claim 4, further comprising a carrier at a back side of the semiconductor substrate.

6. The circuit of claim 5, wherein the carrier is molded on the back side of the semiconductor substrate.

7. The circuit of claim 4, wherein a space between the first area and the second area is filled by the dielectric material.

8. The circuit of claim 4, wherein the metal connection is partly covered by the dielectric material.

9. The circuit of claim 1, wherein the first electrostatic discharge protection device structure comprises a Zener diode structure.

10. The circuit of claim 1, further comprising a passivation layer covering the metal connection such that the metal connection is sandwiched between the dielectric material and the passivation layer.

11. The circuit of claim 10, further comprising a mold compound layer covering the passivation layer such that the passivation layer is sandwiched between the dielectric material and the mold compound layer.

* * * * *